United States Patent
Miura et al.

(10) Patent No.: US 9,602,103 B2
(45) Date of Patent: Mar. 21, 2017

(54) SPIN WAVE DEVICE AND LOGIC CIRCUIT USING SPIN WAVE DEVICE

(71) Applicant: HITACHI, LTD., Chiyoda-ku, Tokyo (JP)

(72) Inventors: Katsuya Miura, Tokyo (JP); Susumu Ogawa, Tokyo (JP); Kenchi Ito, Tokyo (JP); Masaki Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/893,060

(22) PCT Filed: May 22, 2013

(86) PCT No.: PCT/JP2013/064145
§ 371 (c)(1),
(2) Date: Nov. 21, 2015

(87) PCT Pub. No.: WO2014/188525
PCT Pub. Date: Nov. 27, 2014

(65) Prior Publication Data
US 2016/0105176 A1    Apr. 14, 2016

(51) Int. Cl.
*H03K 19/18* (2006.01)
*H03K 19/00* (2006.01)
(Continued)

(52) U.S. Cl.
CPC ........ *H03K 19/0016* (2013.01); *G11C 11/161* (2013.01); *G11C 11/1675* (2013.01);
(Continued)

(58) Field of Classification Search
CPC .......... H03K 17/90; H03K 19/18; H03K 3/59; G11C 11/16; G11C 11/161
(Continued)

(56) References Cited

U.S. PATENT DOCUMENTS

| 6,829,161 B2 * | 12/2004 | Huai ................. G11C 11/16 365/158 |
| 7,528,456 B1 * | 5/2009 | Khitun ................. H03K 19/18 257/421 |

(Continued)

FOREIGN PATENT DOCUMENTS

| JP | 2009-200123 A | 9/2009 |
| JP | 2012-28794 A | 2/2012 |

(Continued)

OTHER PUBLICATIONS

Khitun, A., et al.; "Spin Wave Magnetic NanoFabric: A New Approach to Spin-Based Logic Circuitry"; IEEE Trans. Mag.; vol. 44; 2141-2152, (2008).

(Continued)

*Primary Examiner* — Jason M Crawford
(74) *Attorney, Agent, or Firm* — Miles & Stockbridge P.C.

(57) ABSTRACT

As a technique for attaining a reduction in power consumption, there is a technique for reducing power consumption using a spin wave. No specific proposal concerning spin wave generation, spin wave detection, and a latch technique for information has been made.
A device applies an electric field to a first electrode of a nonmagnetic material using a thin line-shaped stacked body including a first ferromagnetic layer and a nonmagnetic layer to thereby generate a spin wave in the first ferromagnetic layer, and detects a phase or amplitude of the spin wave propagated in the first ferromagnetic layer using a second electrode of a ferromagnetic material with a magnetoresistance effect.

15 Claims, 13 Drawing Sheets

(51) Int. Cl.
| | |
|---|---|
| H01L 29/82 | (2006.01) |
| H03K 19/16 | (2006.01) |
| H01L 29/66 | (2006.01) |
| H01L 29/10 | (2006.01) |
| G11C 11/16 | (2006.01) |
| H01L 27/22 | (2006.01) |
| H01L 43/02 | (2006.01) |
| H01L 43/08 | (2006.01) |
| H03K 3/356 | (2006.01) |
| H03L 7/00 | (2006.01) |

(52) U.S. Cl.
CPC .......... *H01L 27/22* (2013.01); *H01L 29/1029* (2013.01); *H01L 29/66984* (2013.01); *H01L 29/82* (2013.01); *H01L 43/02* (2013.01); *H01L 43/08* (2013.01); *H03K 3/356* (2013.01); *H03K 19/16* (2013.01); *H03K 19/18* (2013.01); *H03L 7/00* (2013.01)

(58) Field of Classification Search
USPC .......................... 365/158, 171, 173; 257/421
See application file for complete search history.

(56) References Cited

U.S. PATENT DOCUMENTS

| | | | |
|---|---|---|---|
| 8,164,148 B2 | 4/2012 | Kim et al. | |
| 8,399,941 B2* | 3/2013 | Apalkov | G11C 11/16 257/295 |
| 8,432,009 B2* | 4/2013 | Apalkov | G11C 11/16 257/295 |
| 8,625,335 B2 | 1/2014 | Morise et al. | |
| 9,208,845 B2* | 12/2015 | Currivan Incorvia | G11C 11/161 |
| 2002/0105827 A1* | 8/2002 | Redon | B82Y 10/00 365/173 |
| 2015/0085569 A1 | 3/2015 | Nozaki et al. | |
| 2015/0138877 A1* | 5/2015 | Nebashi | H03K 19/18 365/158 |

FOREIGN PATENT DOCUMENTS

| | | |
|---|---|---|
| JP | 2012-204802 A | 10/2012 |
| JP | 2013-45840 A | 3/2013 |

OTHER PUBLICATIONS

Ikeda, S., et al.; "Tunnel Magnetoresistance of 604% at 300 K by suppression of Ta diffusion in CoFeB/MgO/CoFeB pseudo-spin-valves annealed at high temperature"; Appl. Phys. Lett. 93; 082508-1-082508-3, (2008).

Ikeda, S., et al.; "A perpendicular-anisotropy CoFeB—MgO magnetic tunnel junction"; Nature Materials; vol. 9; pp. 721-724; (2010).

Khitun, A. et al., Non-volatile magnonic logic circuits engineering, Journal of Applied Physics, Aug. 4, 2011, 110, pp. 034306-1 to 034306-11.

Office Action for related Japanese Application No. 2015-517972 (Dispatch date: Aug. 23, 2016.

* cited by examiner

SPIN WAVE DEVICE AND LOGIC CIRCUIT USING SPIN WAVE DEVICE

TECHNICAL FIELD

The present invention relates to a spin wave device including spin wave generation, spin wave propagation, spin wave detection, and a latch technique for information and further relates to an ultra-low power consumption logic integrated circuit using the spin wave device.

BACKGROUND ART

It is said that a reduction in power consumption in an LSI for a trunk network router is essential to cope with a global increase in an amount of information communication. There are increasing needs for analyzing and processing, at high speed and low costs, a large amount of indefinite dynamic data accumulated in a server. However, a logic integrated circuit that takes on the analysis and the processing has limits in a reduction in power consumption through element refining of a conventional COMS and operation optimization.

As means for solving these problems, there is a method of using a spin wave described in NPL 1. The spin wave means spatial and temporal changes in magnetization direction in a ferromagnetic material like a wave. There is no loss of energy in propagation of the spin wave. An arithmetic circuit using spin wave having an interference effect of a characteristic of the wave has been proposed. Ultra-low power consumption of a logic circuit is enabled by making use of the method and the arithmetic circuit.

CITATION LIST

Non Patent Literature

NPL 1: A. Khitun, M. Bao, and K. L. Wang, "Spin Wave Magnetic NanoFabric: A New Approach to Spin-Based Logic Circuitry", IEEE Trans. Mag 44, 2141 (2008).

NPL 2: S. Ikeda, J. Hayakawa, Y. Ashizawa, Y. M. Lee, K. Miura, H. Hasegawa, M. Tsunoda, F. Matsukura, and H. Ohno, "Tunnel Magnetoresistance of 604% at 300 K by suppression of Ta diffusion in CoFeB/MgO/CoFeB pseudo-spin-valves annealed at high temperature", Appl. Phys. Lett. 93, 082508 (2008).

NPL 3: S. Ikeda, K. Miura, H. Yamamoto, K. Mizunuma, H. D. Gan, M. Endo, S. Kanai, J. Hayakawa, F. Matsukura, and H. Ohno, "A perpendicular-anisotropy CoFeB—MgO magnetic tunnel junction", Nature Mater. 9, 721 (2010).

SUMMARY OF INVENTION

Technical Problem

In a logic circuit using a spin wave, in addition to ultra-low power consumption, possibilities of miniaturization and high speed are also indicated. However, no specific proposal concerning spin wave generation, spin wave detection, and a latch technique for information has been made.

It is an object of the invention to provide a spin wave device including forms capable of realizing spin wave generation, spin wave detection, and a latch technique for information in the spin wave device.

Solution to Problem

In the invention, a modulation effect of magnetization by an electric field is used for spin wave generation. When an electric field is applied to a ferromagnetic material, the direction of magnetization locally changes. However, when the magnetization direction locally changes, the ferromagnetic material becomes energetically unstable. Therefore, in order to relax the instability, the local change in the magnetization tends to spread to the entire ferromagnetic material. At this point, the change in the magnetization direction in the ferromagnetic material spatially and temporally spreads like a wave. This is excitation of a spin wave by an electric field in the invention.

On the other hand, a magnetoresistance effect is used for detection of a spin wave. The magnetoresistance effect is a resistance change in an element including a three-layer structure of a ferromagnetic layer/a nonmagnetic layer/a ferromagnetic layer as a basic structure. As a general example, one of the ferromagnetic layers is set as a free layer in which magnetization is variable and the other of the ferromagnetic layers is set as a fixed layer in which magnetization is fixed. When the magnetizations of the two ferromagnetic layers are parallel, element resistance is a minimum value. When the magnetizations are antiparallel, the resistance is a maximum value. When a magnetization direction of the free layer continuously changes, the resistance also continuously changes according to the change in the magnetization direction. In a spin wave device, a ferromagnetic layer in which a spin wave propagates is set as a free layer in which a magnetization direction is variable. In this case, when the spin wave propagates to a detection portion (a structure showing the magnetoresistance effect) of the spin wave device, a magnetization direction of a portion equivalent to the free layer changes. Since the resistance changes according to the change in the magnetization direction, it is possible to detect the spin wave by measuring the resistance at timing when the spin wave propagates.

Movement of a magnetic domain wall is used for latching the spin wave. In this case, the magnetic domain wall is introduced into the ferromagnetic layer in which the spin wave propagates. When the spin wave propagates and reaches the magnetic domain wall, the magnetic domain wall moves according to the amplitude of the spin wave. This is due to transfer of an angular momentum between the spin wave and the magnetic domain wall. With this, it is possible to detect the spin wave by detecting the position of the magnetic domain wall. After the magnetic domain wall moves, even if the spin wave attenuates, the magnetic domain wall stays in a place to which the magnetic domain wall has moved. This makes it possible to keep information and function as latch.

It is possible to realize a logic integrated circuit by the spin wave by using these means. The logic integrated circuit by the spin wave is made of a material substantially the same as the material of a tunnel magnetic resistance effect element (TMR element), which is a recording element of a magnetic memory (a Magnetoresistance Random Access Memory; MRAM). Therefore, it is possible to manufacture a spin wave device in a layer same as a layer of the TMR element in a manufacturing process same as a manufacturing process of the TMR element in a semiconductor manufacturing process.

Advantageous Effect of Invention

By applying the logic circuit using the spin wave, it is possible to realize ultra-low power consumption, miniaturization, and high speed that cannot be realized by the conventional logic circuit using the CMOS.

DESCRIPTION OF EMBODIMENTS

First Embodiment

A spin wave device is a device that converts an input signal ("0" or "1") into a spin wave corresponding to "0" or "1", propagates the spin wave to an output unit present in a place apart from an input unit, and read out. Major characteristics are that consumption of electric power is extremely small in a portion that generates the spin wave corresponding to the input signal, a portion that propagates the spin wave, and a portion that outputs the spin wave. It is possible to convert two input signals respectively into spin waves, cause the two spin waves to interfere with each other to cause the spin waves to operate like a logic gate, and output logic. By disposing the logic gate by the spin wave device in multiple stages, it is possible to form a logic circuit. In the following explanation, an operation principle of the spin wave device is explained with reference to the figures.

Figure 1:
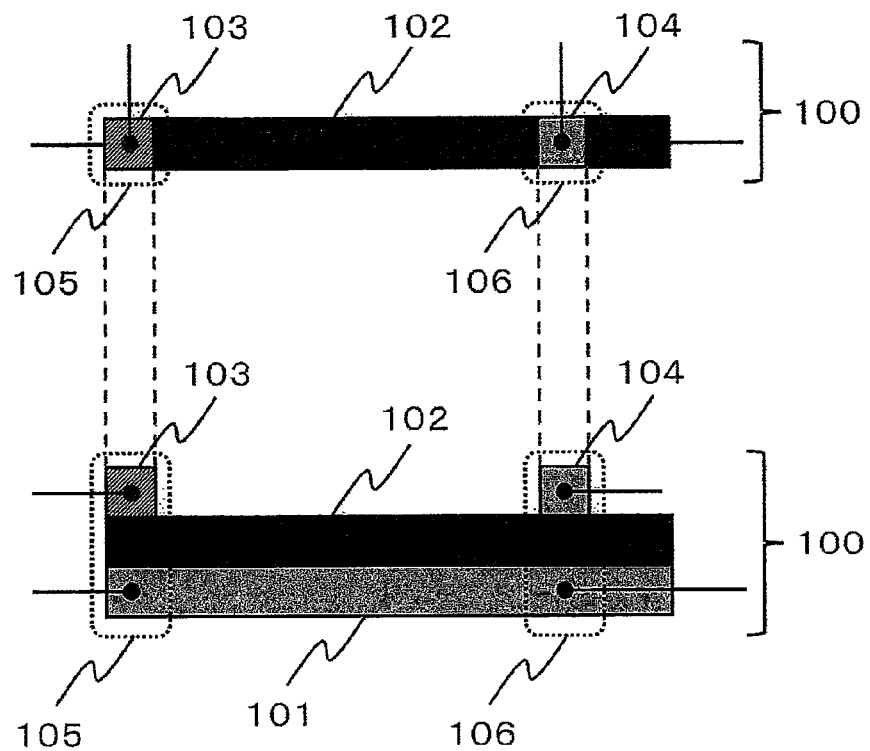
FIG. 1 is a conceptual diagram of a spin wave device described in a first embodiment.

According to a viewpoint of the invention, as shown in FIG. 1, a spin wave device 100 includes a thin line-shaped stacked body in which a first ferromagnetic layer 101 and a first nonmagnetic layer 102 are stacked in this order, includes a first electrode 103 on the first nonmagnetic layer 102, and includes a second electrode 104 in a position different from the position of the first electrode 103 on the first nonmagnetic layer 102. The second electrode 104 is a ferromagnetic material. A magnetization direction of the second electrode 104 is fixed. A part of the first nonmagnetic layer 102 and the first ferromagnetic layer 101 present right under the first electrode 103 configures an input portion 105 including the first electrode 103. A part of the first nonmagnetic layer 102 and the first ferromagnetic layer 101 present right under the second electrode 104 configures an output portion 106 including the second electrode 104.

Electrodes are provided at both ends of the first ferromagnetic layer 101. Consequently, it is possible to apply a voltage between the first electrode 103 and an end portion of the first ferromagnetic layer 106 on a side closer to the first electrode 103. The spin wave device 100 includes a mechanism for reading resistance in a film surface perpendicular direction of the output portion 106 (a mechanism for applying a micro-voltage of a degree not affecting magnetization of the second electrode 104 and the first ferromagnetic layer 101 and reading an electric current or a mechanism for applying a micro-current and reading a voltage). Therefore, the output portion 106 is formed in a three-layer structure of a ferromagnetic layer/a nonmagnetic layer/a ferromagnetic layer and shows a so-called magnetoresistance effect. The spin wave device 100 includes, on the outside, a mechanism for generating a clock signal.

Figure 2:
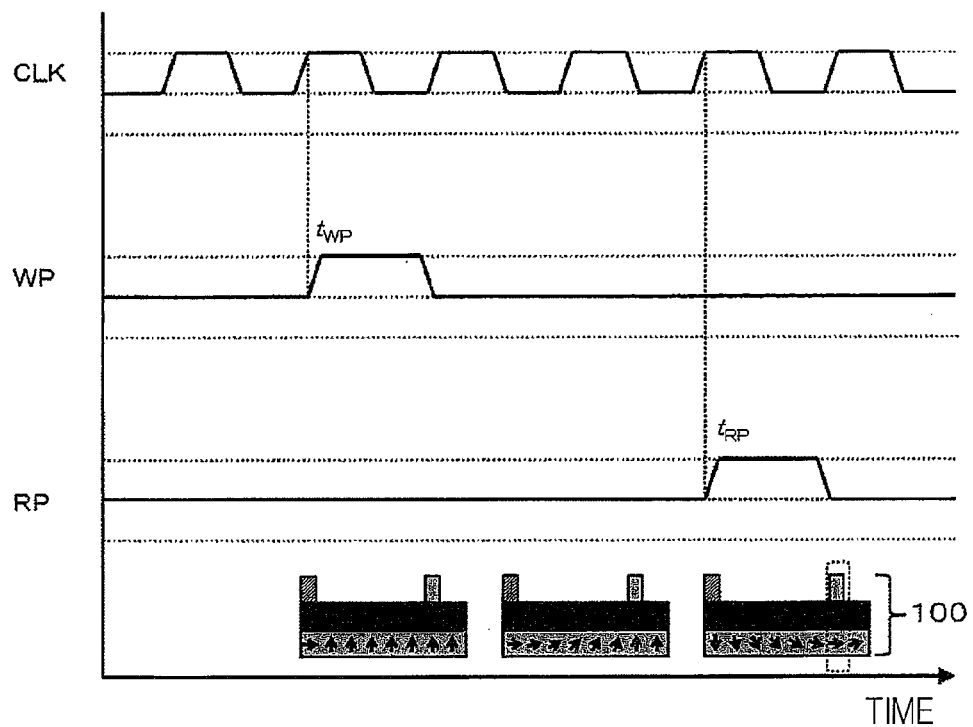
FIG. 2 is a conceptual diagram showing operation timings of a clock signal, a write pulse (WP) applied from a first electrode 103, and a read pulse (RP) applied from a second electrode 104 in the spin wave device described in the first embodiment and a magnetization direction of the spin wave device.

FIG. 2 is a diagram showing an example of operation timings of a clock signal, a write pulse (WP) applied from the first electrode 103, and a read pulse (RP) applied from the second electrode 104. In the example shown in FIG. 2, CoFeB is used in the first ferromagnetic layer 101, MgO is used in the first nonmagnetic layer 102, Au is used in the first electrode 103, and CoFeB is used in the second electrode 104.

When a combination of the CoFeB and the MgO is used, magnetic anisotropy of the CoFeB can be controlled with a film thickness. Usually, magnetization of a CoFeB thin film aligns in a parallel direction with respect to a film surface. In the case of the CoFeB set in contact with the MgO, when the film thickness of the CoFeB is reduced, the magnetization is in a direction perpendicular to the film surface. A reason for this is explained by conflict of magnetic anisotropy in a perpendicular direction on an interface between the CoFeB and the MgO and CoFeB crystal magnetic anisotropy in an in-plane direction. That is, when the CoFeB film thickness is large, the CoFeB crystal magnetic anisotropy becomes predominant and the magnetization is in the in-plane direction. However, when the CoFeB film thickness is reduced, the interface magnetic anisotropy becomes predominant and the magnetization is in the perpendicular direction. Making use of this principle, the magnetization of the first ferromagnetic layer 101 is set in a perpendicular upward direction with respect to the film surface and the magnetization of the second electrode 104 is set in a parallel rightward direction with respect to the film surface. Therefore, the film thickness of the first ferromagnetic layer 101 is designed to be 1.4 nm such that the crystal magnetic anisotropy of the CoFeB is smaller than the interface magnetic anisotropy between the CoFeB and the MgO. The film thickness of the second electrode 104 is designed to be 3.0 nm such that the crystal magnetic anisotropy of the CoFeB is larger than the interface magnetic anisotropy between the CoFeB and the MgO. The film thickness of the MgO is set to 2.0 nm such that a magnetoresistance effect (in this case, a tunnel magnetoresistance effect) increases in the output portion 106.

In the first embodiment, the CoFeB is used in the first ferromagnetic layer 101 and the second electrode 104 and the MgO is used in the first nonmagnetic layer. However, other materials may be used. For example, various ferromagnetic materials can be used in the first ferromagnetic layer 101 and the second electrode 104. However, a material having a large magnetoresistance effect and large modulation of magnetization by an electric field is desirable. Any material can be used in the first nonmagnetic layer as long as the material is a nonmagnetic material. As combinations of such materials, there are a ferromagnetic material containing at least one or more 3d transition metal elements for a ferromagnetic layer and an oxide insulator containing oxygen for a nonmagnetic layer. A reason for using these materials is that, for example, a large output is easily obtained because a so-called tunnel magnetoresistance effect is obtained. Further, large interface magnetic anisotropy is obtained by bonding of 3d transition metal and oxygen. Therefore, another reason is that, for example, it is easy to control modulation of magnetization by an electric field according to film thickness control of the ferromagnetic layer.

In particular, as described in Non Patent Literature 2, the magnetoresistance effect is large in the combination of the CoFeB and the MgO. As described in Non Patent Literature 3, it is possible to control the direction of magnetic anisotropy with the film thickness of the CoFeB. Therefore, an electric field effect increases by setting a film thickness near a boundary between a film thickness with which the magnetization is parallel to the film surface and a film thickness with which the magnetization is perpendicular to the film surface.

At time $t_{WP}$ synchronizing with a clock signal, when a voltage signal is applied to the first electrode 103, an electric field is applied to the first ferromagnetic layer 101 via the first nonmagnetic layer 102. At this point, the direction of magnetization locally changes in a portion of the first ferromagnetic layer 101 included in the input portion 105. In the example shown in FIG. 2, an electric field is applied from the first electrode 103, whereby magnetization of the first ferromagnetic layer 101 locally becomes parallel to the film surface. This is caused because magnetic anisotropy of a portion right under the first electrode 103 in the first ferromagnetic layer 101 is modulated by the electric field application. What is modulated by the electric field is the interfacial magnetic anisotropy along a direction perpendicular to the film surface. When the interfacial magnetic anisotropy decreases, the crystal magnetic anisotropy of the CoFeB becomes relatively predominant and the magnetization changes to the parallel direction with respect to the film surface. To efficiently modulate the interface magnetic anisotropy with the electric field, the film thickness of the first ferromagnetic layer 101 only has to be designed slightly smaller than the film thickness of the interface where the magnetization becomes parallel. In this example, the film thickness is set to 1.4 nm as explained above.

When a part of the first ferromagnetic layer 101 has magnetization in the parallel direction with respect to the film surface, the first ferromagnetic layer 101 becomes unstable in terms of energy. In order to stabilize the first ferromagnetic layer 101 in terms of energy, it is attempted to average a magnetization direction in the entire first ferromagnetic layer 101, then the magnetization temporally and spatially changes like a wave. This is a spin wave, and an angle of the magnetization from the direction perpendicular to the film surface corresponds to amplitude. A wavelength, speed, and the like, which are characteristics of the spin wave, are controlled with the pulse width of WP and the material, the shape, and the like of the first ferromagnetic layer 101. It is possible to control, with an external magnetic field uniformly applied to the entire spin wave device 100, a propagation direction of the spin wave. Therefore, the spin wave device 100 may include a mechanism for applying the external magnetic field. The spin wave induced by the electric field applied from the first electrode 103 propagates toward the second electrode 104.

Figure 3:
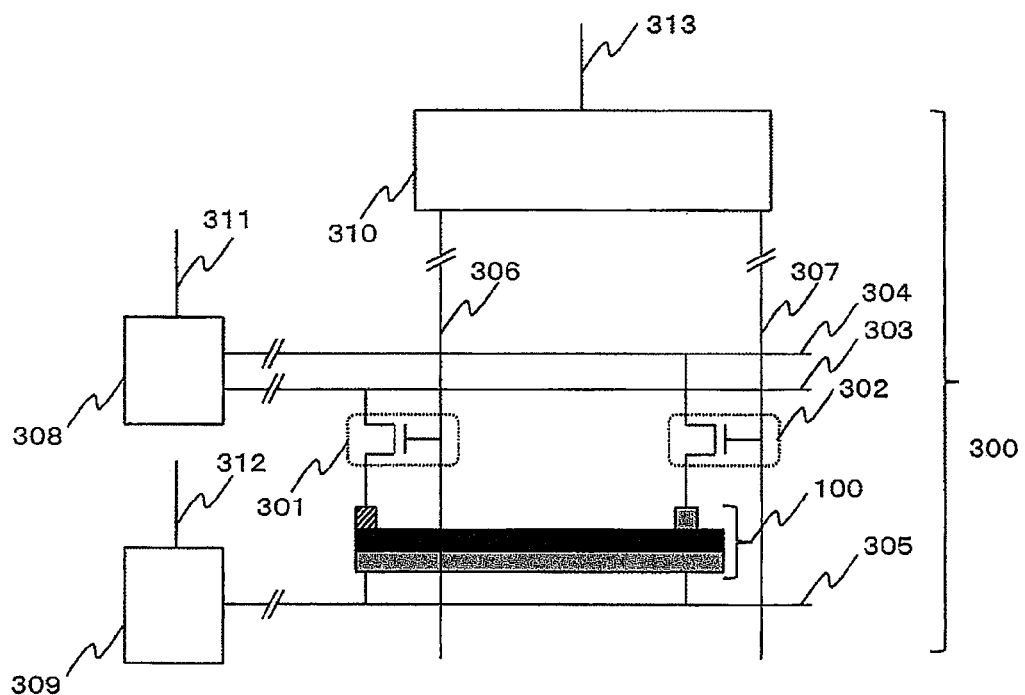
FIG. 3 is a circuit configuration of the spin wave device described in the first embodiment.

A diagram schematically showing a circuit configuration 300 for realizing such an operation of the spin wave device 100 is FIG. 3. In FIG. 3, the first electrode 103 is electrically connected to a source electrode of a first selection transistor 301. The second electrode 104 is electrically connected to a source electrode of a second selection transistor 302. A drain electrode of the first selection transistor 301 is electrically connected to a first bit line 303. A drain electrode of the second select ion transistor 302 is electrically connected to a second bit line 304. Electrodes present at both ends of the first ferromagnetic layer 101 are electrically connected to a source line 305. A gate electrode of the first selection transistor 301 is electrically connected to a first word line 306. A gate electrode of the second selection transistor 302 is electrically connected to a second word line 307. One ends of the first bit line 303 and the second bit line 304 are electrically connected to a bit line driver 308. One end of the source line 305 is electrically connected to a source line driver 309. The first word line 306 and the second word line 307 are electrically connected to a word line driver 310. A clock input line 311 is electrically connected to the bit line driver 308. A clock input line 312 is electrically connected to the source line driver 309. A clock input line 312 is electrically connected to the word line driver 310. Timings of voltages applied to the first bit line 303, the second bit line 304, the source line 305, the first word line 306, and the second word line 307 are controlled according to clock signals input from the respective clock input lines. In the following explanation, the bit line driver 308, the source line driver 309, the word line driver 310, the clock input line 311 of the bit line driver 308, the clock input line 312 of the source line driver 309, and the clock input line 313 of the word line driver 310 are not shown in the figures.

It is desirable to add a mechanism for applying a magnetic field to the entire spin wave device 100. As the mechanisms, it is conceivable to adopt a method of, for example, disposing a magnetic material around the spin wave device 100 or disposing a wire right under the first ferromagnetic layer 101 of the spin wave device 100 and using a magnetic field induced by an electric current applied to the wire.

A voltage for exciting a spin wave with an electric field is applied to the first bit line 303. In this state, when a voltage corresponding to a WP is applied to the first word line 306, the first selection transistor 301 changes to an ON state and the spin wave is excited. A voltage for reading the resistance of the output portion 106 is applied to the second bit line 304. In this state, when a voltage corresponding to an RP is applied to the second word line 307, the second selection transistor 302 changes to the ON state and the resistance can be read.

Figure 4:
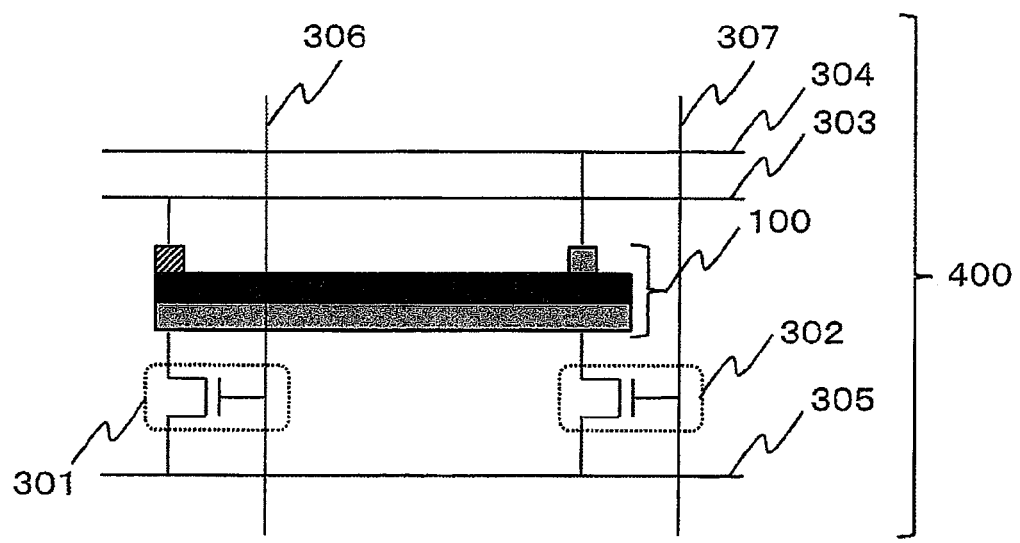
FIG. 4 is a circuit configuration of the spin wave device described in the first embodiment.

In a circuit configuration 400 shown in FIG. 4, a positional relation of the first selection transistor 301 and the second selection transistor 302 with the spin wave device 100 is opposite to the positional relation shown in FIG. 3. Even with such a configuration, an operation same as the operation of the circuit configuration 300 is possible. Further, since the spin wave device is disposed above the transistors, it is easy to manufacture the spin wave device.

Figure 5:
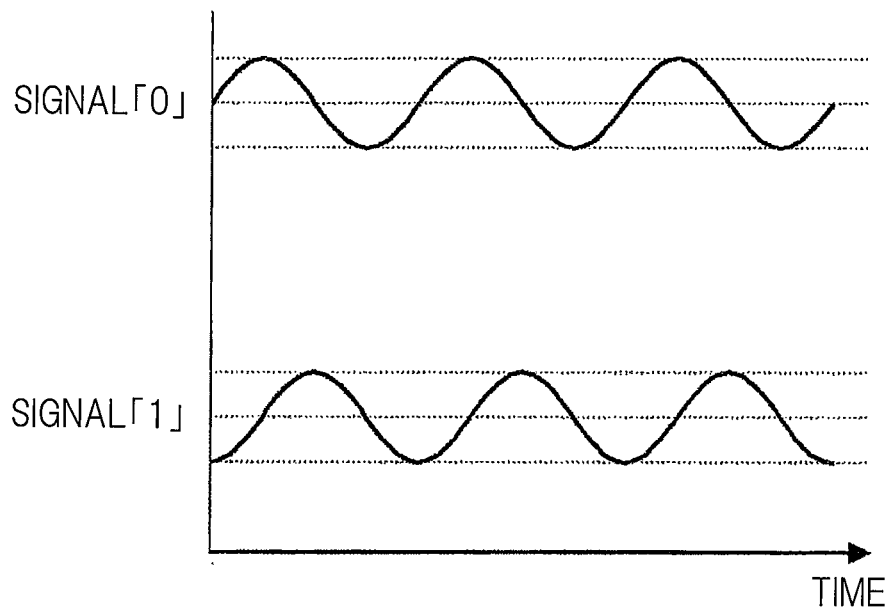
FIG. 5 is a schematic diagram of a spin wave having information of [0] and [1] in the spin wave device described in the first embodiment.

The generated spin wave has information of a signal "0" or "1". The information of "0" or "1" is characterized by a phase of the spin wave. In an example shown in FIG. 5, a spin wave phase-shifted by $\pi/2$ from the spin wave having the information of the signal "0" is represented as "1".

In order to generate, according to an input signal, such a spin wave having the phase different by $\pi/2$, when the WP is applied, the application of the WP only has to be delayed by time equivalent to $\pi/2$. The spin wave device 100 may include such a delay circuit.

Alternatively, when the spin wave of "1" is generated with respect to the spin wave of "0", a voltage only has to be applied to the first electrode 103 at timing delayed by one clock signal. In this case, a characteristic of the spin wave only has to be controlled such that a cycle of the clock signal is equivalent to $\frac{1}{4}$ of a spin wave cycle.

When the spin wave propagates in the first ferromagnetic layer 101 and reaches the output portion 106, a voltage (an electric current) is applied at time $t_{RP}$ in synchronization with the clock signal in the second electrode 104. An electric current (a voltage) flowing in the film surface perpendicular direction of the output portion 106 is read. A magnetization direction of a part of the first ferromagnetic layer 101 included in the output portion 106 changes by a generated spin wave. Therefore, the resistance in the film surface perpendicular direction of the output portion 106 changes with the magnetoresistance effect.

Figure 6:
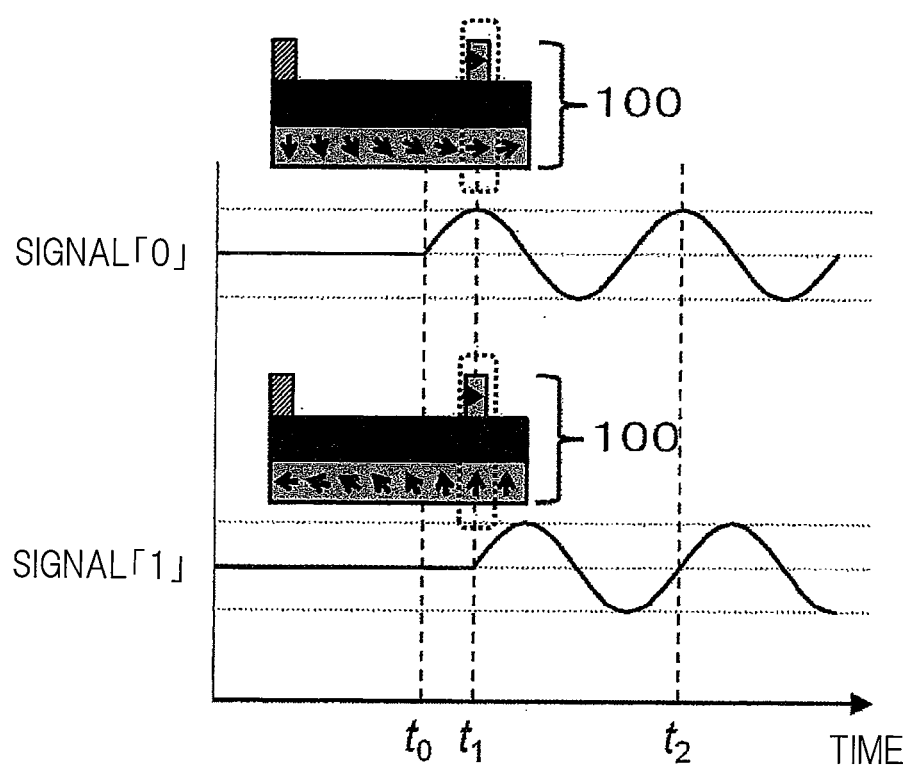
FIG. 6 is a schematic diagram showing the spin wave having the information of [0] and [1] propagated to an output portion 106 in the spin wave device described in the first embodiment and a magnetization direction of a first ferromagnetic layer 101 at that point.

FIG. 6 schematically shows spin waves having the information of "0" and "1" propagated to the output portion 106 and the magnetization direction of the first ferromagnetic layer 101 at that point. The spin wave having the information of "0" reaches the output portion 106 at time $t_0$, and its amplitude is maximized at time $t_1$. On the other hand, the spin wave having the information of "1" reaches the output portion at time $t_1$. Therefore, when $t_{RP}=t_1$, the resistance in the film surface perpendicular direction of the output portion 106 at the time when the spin wave of the signal "0" reaches is low because of the magnetoresistance effect. On the other hand, the resistance in the film surface perpendicular direction of the output portion 106 at the time when the spin wave of the signal "1" reaches is high compared with the resistance at the time when the spin wave of the signal "0" reaches. Consequently, in the output portion, the different spin waves of "0" or "1" can be detected and output. Similarly, the spin waves can be detected when $t_{RP}=t_2$.

Figure 7:
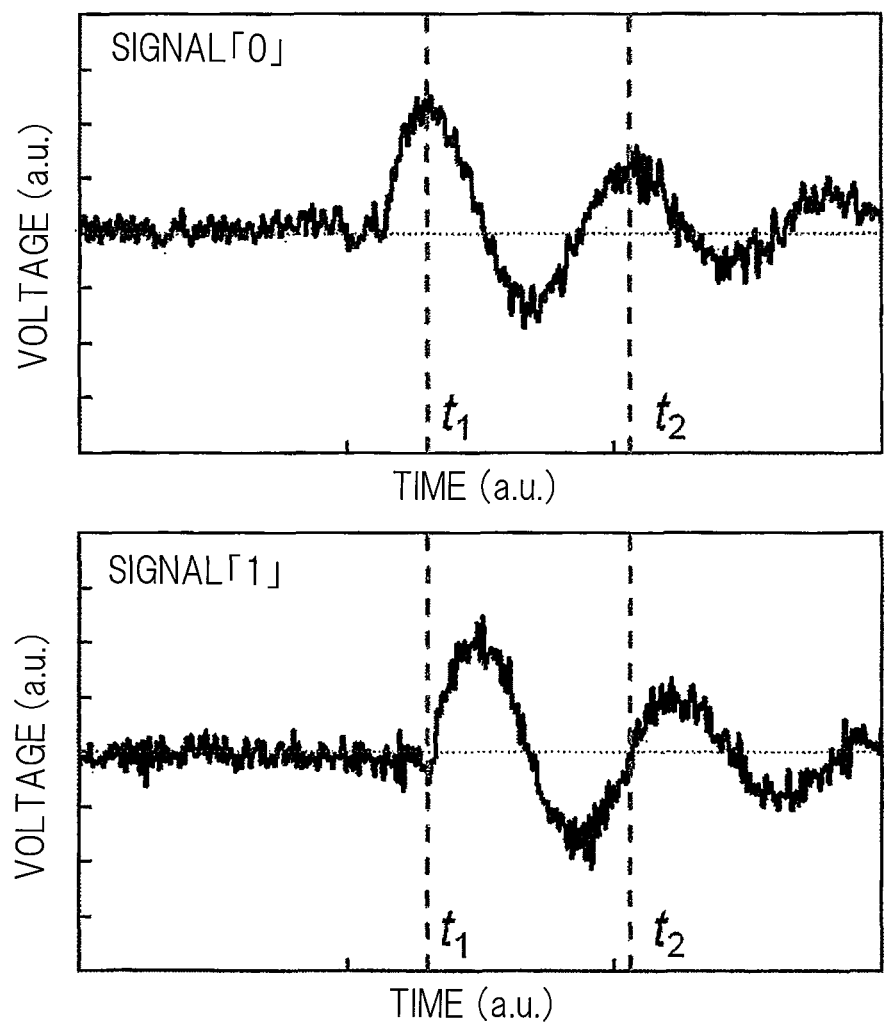
FIG. 7 is a diagram showing a temporal change of an output signal obtained by measuring, via a reference resistor, as a voltage, the magnitude of an output current at the time when a micro-voltage is applied in a film surface perpendicular direction of the output portion 106 in the spin wave device described in the first embodiment.

FIG. 7 is a diagram showing a temporal change of an output signal obtained by measuring, via a reference resistor, as a voltage, the magnitude of an output current at the time when a micro-voltage is applied in the film surface perpendicular direction of the output portion 106. In FIG. 7, a magnetization direction of the first ferromagnetic layer 101 at the time when the amplitude is plus is defined as a parallel right direction with respect to a film surface. Therefore, in an output voltage waveform of the signal "0" in FIG. 7, at $t_1$, a magnetization direction in a portion of the first ferromagnetic layer 101 included in the output portion 106 is a parallel right direction with respect to a film surface and is parallel to magnetization of the second electrode 104.

Therefore, the resistance in the film surface perpendicular direction of the output portion 106 at $t_1$ decreases and an output current increases. Therefore, an output signal in FIG. 7 increases. In an output signal waveform of the signal "1" in FIG. 7, magnetization is in a perpendicular upward direction with respect to the film surface at $t_1$. Therefore, the output signal does not change. When time elapses from $t_1$, an output waveform starts to increase. It is seen from the figure that a waveform delayed by $\pi/2$ from the spin wave of the signal "1" can be detected. In this example, $t_{RP}=t_1$. However, timing when it is possible to distinguish which of the spin waves of "0" and "1" propagates is not limited to $t_{RP}=t_1$. Characteristics such as the cycle of the clock signal, the speed, the wavelength of the spin wave, $t_{WP}$ and $t_{RP}$ only have to be controlled such that it is possible to distinguish which of the spin waves "0" and "1" propagates in the output portion 106.

By controlling a voltage applied to the second electrode 104, it is possible to control the spin wave not to propagate from the first electrode 103 passing over a portion right under the second electrode 104. The principle of this operation is that a magnetization direction can be controlled by applying an electric field. When an electric field is applied to the second electrode 104, a magnetization direction of a portion of the first ferromagnetic layer 101 included in the output portion 106 locally changes to a parallel direction. The spin wave is a spatial and temporal change of magnetization. However, when the spin wave reaches a region of magnetization locally strongly fixed and directed in a parallel direction, the spin wave cannot spatially change the magnetization. Therefore, the spin wave cannot propagate passing over a portion right under the second electrode 104.

In the spin wave device manufactured as explained above, in the input portion 105, since the spin wave is generated by the electric field, ideally, there is no consumption of electric power. In the spin wave propagation as well, since the spin wave is the temporal and spatial change in the magnetization direction, electric power is not consumed. In the output portion 106, electric power is consumed in order to read resistance. However, since the resistance is only read, extremely small power is consumed. Therefore, it can be said that the spin wave device is a device that hardly consumes electric power.

Second Embodiment

Figure 8:
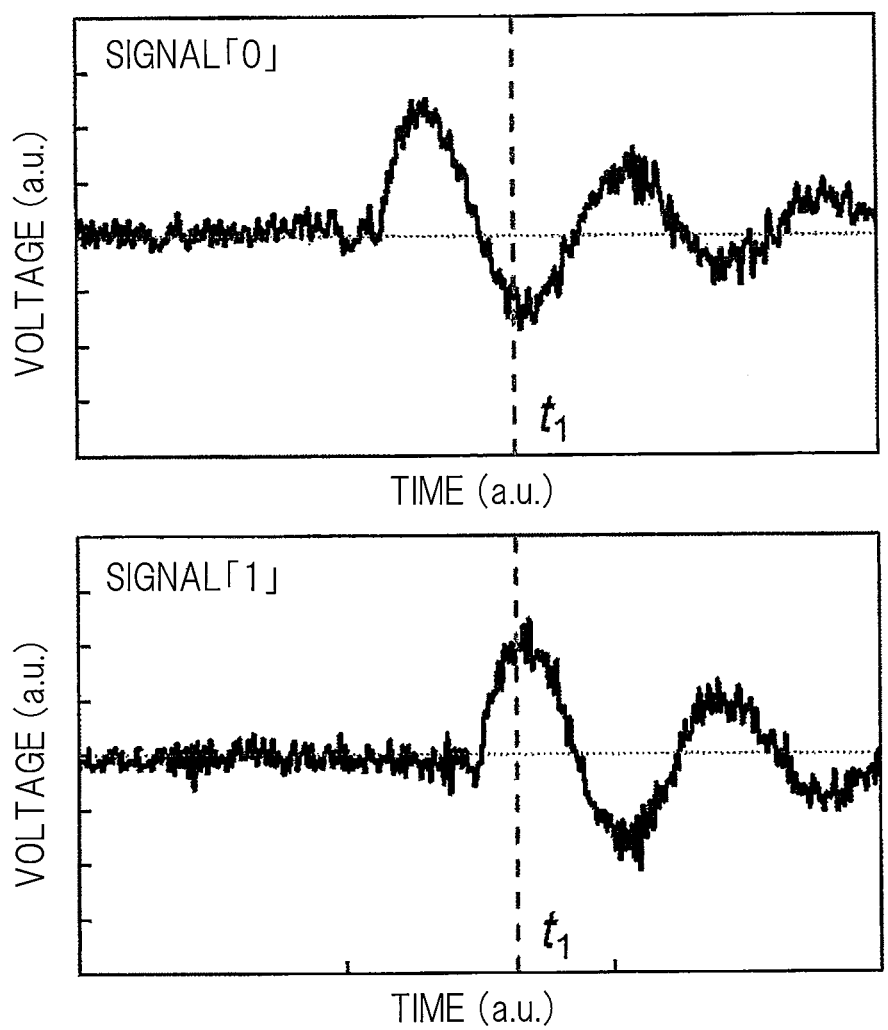
FIG. 8 is a diagram showing a temporal change of an output signal obtained by measuring, via a reference resistor, as a voltage, the magnitude of an output current at the time when a micro-voltage is applied in a film surface perpendicular direction of the output portion 106 in a spin wave device described in a second embodiment.

In the spin wave device 100 described in the first embodiment, the spin wave having the information of "1" is the wave approximately $\pi/2$ different in the phase from the spin wave having the information of "0". According to another viewpoint of the invention, the spin wave having the information of "1" may be a wave phase-shifted by $\pi$ from the spin wave having the information "0". A basic structure of the spin wave device 100 described in a second embodiment is the same as the basic structure shown in FIG. 1. Operation timings of a clock signal, a WP applied from the first electrode 103, and an RP applied from the second electrode 104 are basically the same as the operation timings in FIG. 5. FIG. 8 is a diagram showing a temporal change of an output signal obtained by measuring, via a reference resistor, as a voltage, the magnitude of an output current at the time when a micro-voltage is applied in the film surface perpendicular direction of the output portion 106. In an output voltage waveform of a signal "0" in FIG. 8, at $t_1$, a magnetization direction of the first ferromagnetic layer 101 is a film surface parallel left direction with respect to a film surface and antiparallel to magnetization of the second electrode 104. Therefore, the resistance in the film surface perpendicular direction of the output portion 106 at $t_1$ increases and an output current decreases. Therefore, an output signal in FIG. 8 decreases. In an output signal waveform of a signal "1" in FIG. 8, at $t_1$, magnetization is in a film surface parallel right direction with respect to film surface. Therefore, the output signal increases. It is seen from this result that, in the output portion 106 of the spin wave device 100 described in the second embodiment, it is possible to distinguish and detect a spin wave having information of "0" or "1". Compared with the spin wave device 100 described in the first embodiment, in the spin wave device 100 described in the second embodiment, a maximum value and a minimum value of the resistance in the film surface perpendicular direction of the output portion 106 are detected. Therefore, there is an advantage that the detection is easy.

Third Embodiment

Figure 9:
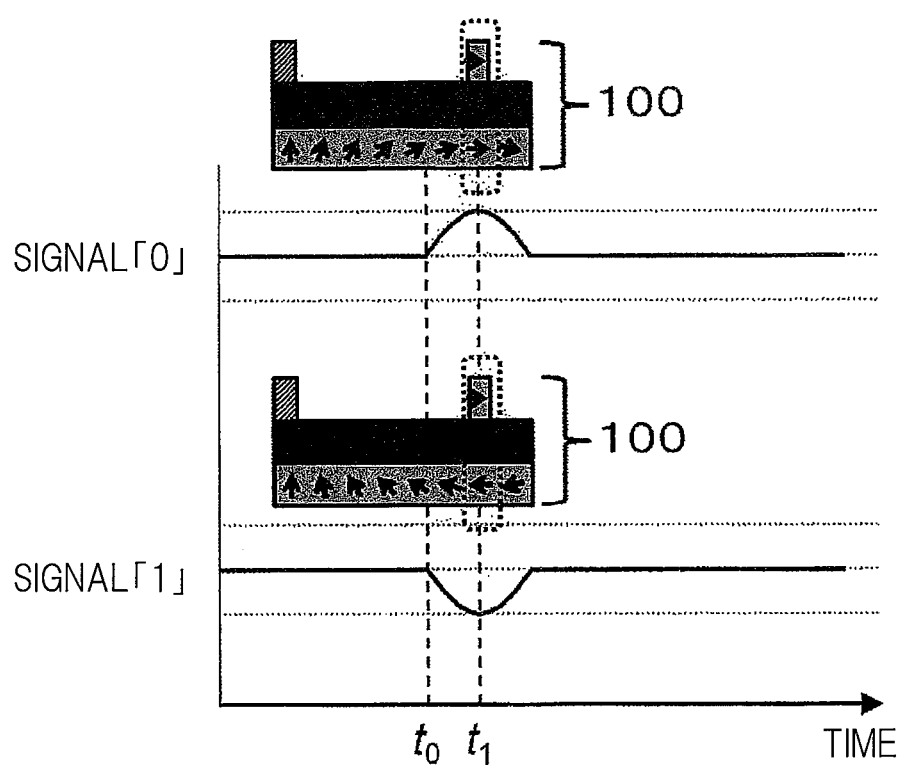
FIG. 9 is a schematic diagram showing a spin wave having information of [0] and [1] propagated to the output portion 106 in a spin wave device described in a third embodiment and a magnetization direction of the first ferromagnetic layer 101 at that point.

In the spin wave device 100 described in the first embodiment and the second embodiment, the information of "0" or "1" of the spin wave is characterized by the phase of the spin wave. According to another viewpoint of the invention, information of "0" or "1" of the spin wave can be characterized by the amplitude of the spin wave. FIG. 9 is schematically shows a spin wave having information of "0" and "1" propagated to the output portion 106 and a magnetization direction of the first ferromagnetic layer 101 at that point. In an example shown in FIG. 9, the amplitude of the spin wave having the information of "0" is plus. At $t_1$, a magnetization direction of a portion of the first ferromagnetic layer 101 included in the output portion 106 is a parallel rightward direction with respect to a film surface. On the other hand, the amplitude of the spin wave having the information of "1" is minus. At $t_1$, the magnetization direction of a portion of the first ferromagnetic layer 101 included in the output portion 106 is a parallel leftward direction with respect to the film surface. That is, the spin waves of "0" and "1" are spin waves phase-shifted by approximately $\pi$. A pulse width of a WP is controlled such that the spin wave is excited only for a half wavelength.

In this way, in order to generate a spin wave having plus or minus amplitude, an external magnetic field only has to be applied in the film surface parallel rightward direction or leftward direction at $t_{WP}$. Alternatively, a field-like torque (FLT) having effects same as the effects of a magnetic field may be controlled and used. In this case, it is possible to obtain a spin wave having amplitude in the rightward direction or the leftward direction by controlling the direction of an effective magnetic field by a FLT with the amplitude of a voltage. Further, it is also conceivable to adopt a method of designing the spin wave device 100 such that an electric current flows a little simultaneously when a voltage is applied in the film surface perpendicular direction of the input portion 105. It is also conceivable to adopt a method of using spin-transfer torque (STT). In this case, it is possible to control a magnetization direction of a spin wave by changing a direction of the electric current, that is, a direction in which the voltage is applied. In both the methods, an effective magnetic field may be extremely small. A reason for that is that energy necessary for directing magnetization of the ideally manufactured first ferromagnetic layer 101 to the rightward direction or the leftward direction is equivalent and, if, for example, energy in the rightward direction decreases even a little because of the effective magnetic field, the magnetization easily turns to the right. Therefore, it is possible to induce a spin wave having amplitude in the rightward direction or the leftward direction with a small effective magnetic field.

When the spin wave propagates in the first ferromagnetic layer 101 and reaches the output portion 106, in the second electrode 104, a voltage (an electric current) is applied at time $t_{RP}$ in synchronization with the clock signal in the second electrode 104. An electric current (a voltage) in the film surface perpendicular direction of the output portion 106 is read. The spin wave propagated in the first ferromagnetic layer 101 changes to a magnetization direction shown in FIG. 9 in the output portion 106. That is, at $t_1$, in the case of the spin wave of the signal "0", the magnetization direction is a film surface parallel rightward direction. In the case of the spin wave of the signal "1", the magnetization direction is a film surface parallel leftward direction. At this point, when the magnitude of an output current at the time when a micro-voltage is applied to the output portion 106 is shown as a temporal change of an output signal measured as a voltage via a reference resistor, the temporal change is as shown in FIG. 10.

Figure 10:
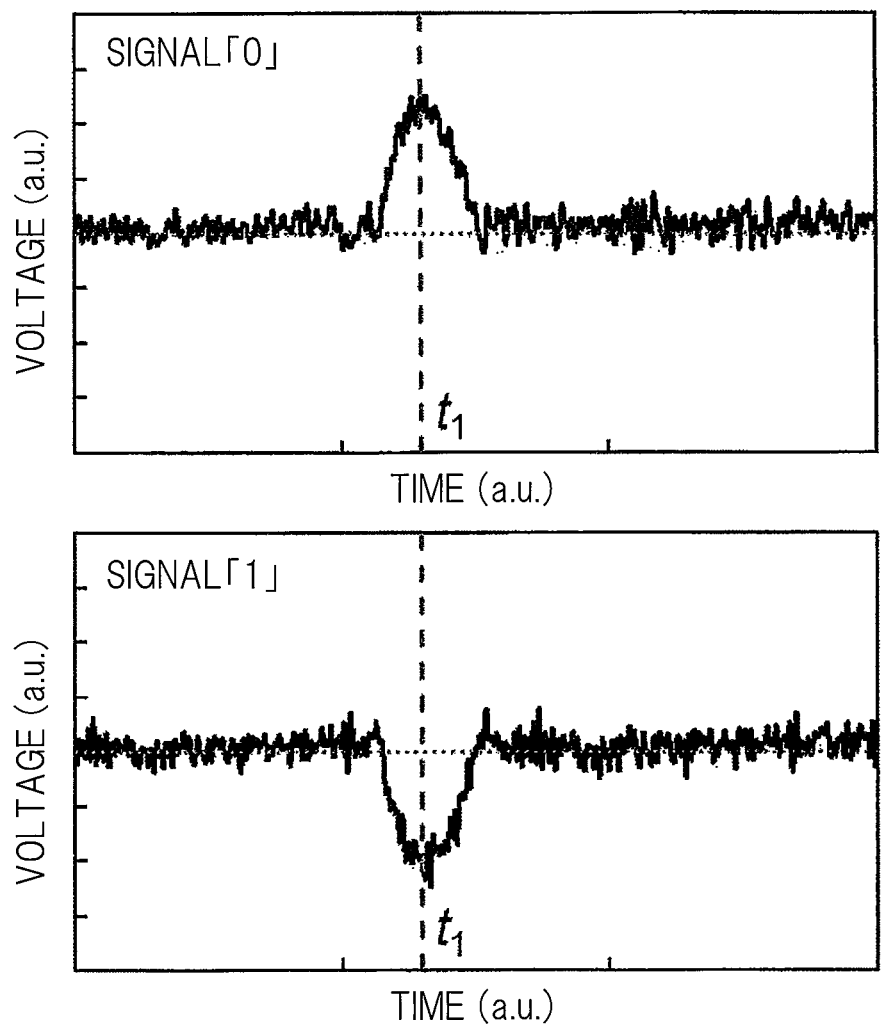
FIG. 10 is a diagram showing a temporal change of an output signal obtained by measuring, via a reference resistor, as a voltage, the magnitude of an output current at the time when a micro-voltage is applied in a film surface perpendicular direction of the output portion 106 in a spin wave device described in the third embodiment.

In an output voltage waveform of the signal "0" in FIG. 10, at $t_1$, the magnetization direction of the first ferromagnetic layer 101 is a parallel rightward direction with respect to a film surface and is parallel to the second electrode 104. Therefore, the resistance in the film surface perpendicular direction of the output portion 106 at $t_1$ decreases and an output current increases. Therefore, an output signal in FIG.

10 increases. In an output signal waveform of the signal "1" in FIG. 10, magnetization is in a parallel leftward direction with respect to the film surface at $t_1$. Therefore, the output signal decreases.

As explained above, even when the information of "0" or "1" of the spin wave is characterized by the amplitude of the spin wave, it is possible to distinguish and detect which of the spin waves of "0" and "1" propagates. When the spin wave devices 100 in the first embodiment and the second embodiment are compared, in this system, a mechanism for applying an external magnetic field, a mechanism for generating FLT, or a mechanism for generating STT is necessary. However, there is an advantage that a mechanism for delaying the phase of the spin wave is unnecessary.

Fourth Embodiment

Figure 11:
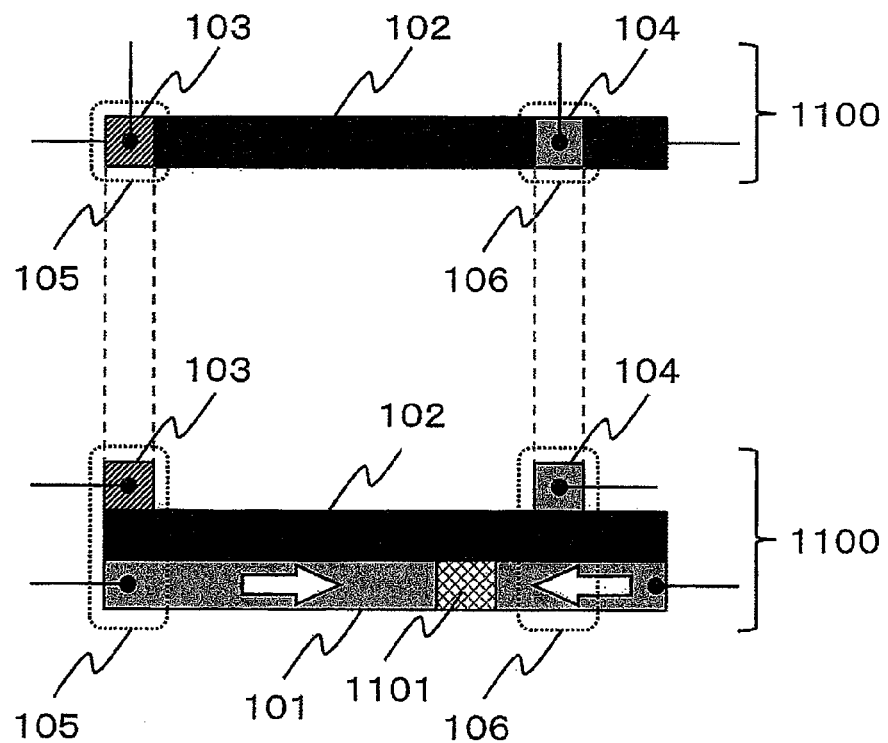
FIG. 11 is a conceptual diagram of a spin wave device into which a magnetic domain wall is introduced described in a fourth embodiment.

In a spin wave device 1100, movement of a magnetic domain wall 1101 may be used for detection of a spin wave propagated to the output portion 106. FIG. 11 shows a device structure for realizing detection of a spin wave using the magnetic domain wall 1101. The magnetic domain wall 1101 is introduced into the first ferromagnetic layer 106 in FIG. 11. The direction of magnetization of the first ferromagnetic layer 106 changes to antiparallel in the magnetic domain wall 1101 serving as a boundary. On the inside of the magnetic domain wall 1101, a magnetization direction spatially continuously changes. Therefore, when the spin wave propagates to the magnetic domain wall 1101, magnetization inside the magnetic domain wall 1101 and the spin wave interact with each other. As a result, the magnetic domain wall 1101 can be moved.

Figure 12:
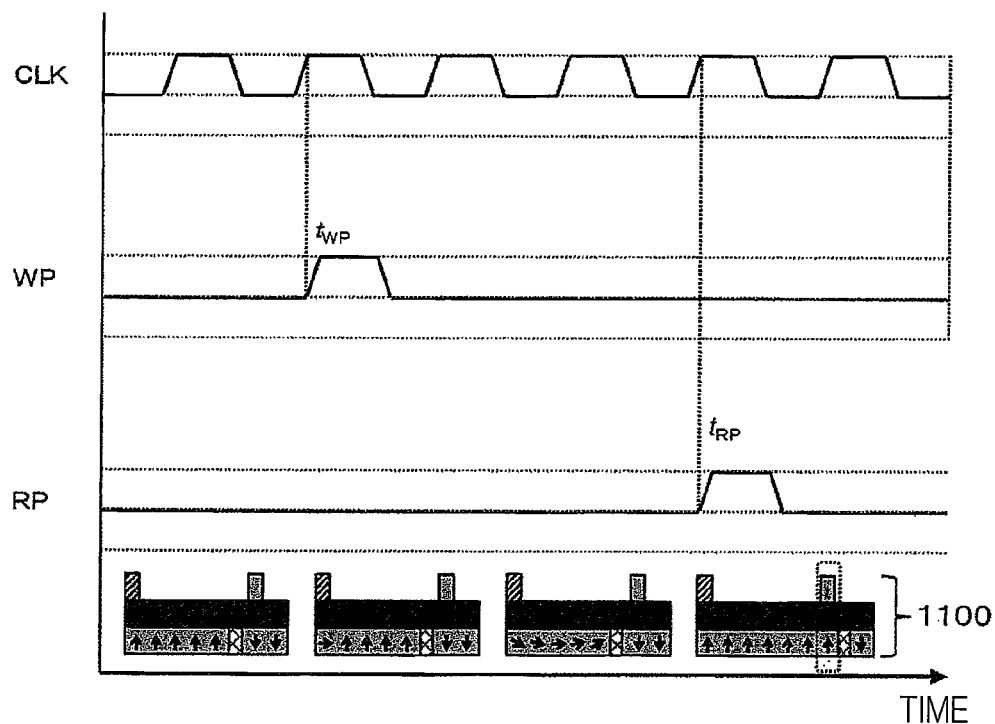
FIG. 12 is a conceptual diagram showing operation timings of a clock signal, a write pulse WP applied from the first electrode 103, and a read pulse RP applied from the second electrode 104 in the spin wave device described in the fourth embodiment and a magnetization direction of the spin wave device.

FIG. 12 shows, as an example, operation timings of a clock signal, a write pulse WP applied from the first electrode 103, and a read pulse RP applied from the second electrode 104 in the spin wave device 1100 described in a fourth embodiment.

At time $t_{WP}$ synchronizing with the clock signal, when a voltage signal is applied to the first electrode 103, an electric field is applied to the first ferromagnetic layer 101 via the first nonmagnetic layer 102. A spin wave is generated in the first ferromagnetic layer 101. The spin wave propagates in the first ferromagnetic layer 101 and reaches the introduced magnetic domain wall 1101. At this point, the magnetic domain wall 1101 moves by interaction of the spin wave and the magnetic domain wall 1101. A direction in which the magnetic domain wall 1101 moves depends on a direction in which magnetization of the spin wave tilts.

Figure 13:
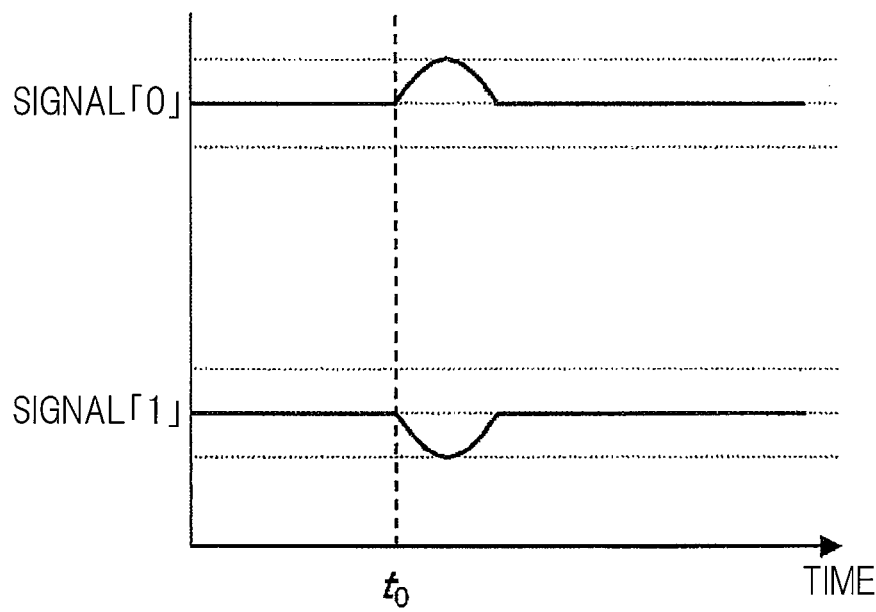
FIG. 13 is a schematic diagram of a spin wave having information of [0] and [1] in the spin wave device described in the fourth embodiment.

In the following explanation, an example is explained in which a magnetization direction of the first ferromagnetic layer 101 is a perpendicular upward direction with respect to a film surface. The generated spin wave has information of a signal "0" or "1". FIG. 13 schematically shows a spin wave having information of "0" or "1" propagated to the output portion 106 in the spin wave device into which the magnetic domain wall 1101 is introduced. In an example shown in FIG. 13, the amplitude of the spin wave having the information of "0" is plus. At $t_1$, a magnetization direction of a part of the first ferromagnetic layer 101 included in the output portion 106 is a parallel rightward direction with respect to the film surface. On the other hand, the amplitude of the spin wave having the information of "1" is minus. At $t_1$, the magnetization direction of a part of the first ferromagnetic layer 101 included in the output portion 106 is a parallel leftward direction with respect to the film surface. That is, the spin waves of "0" and "1" are spin waves phase-shifted by n. A pulse width of the WP is controlled such that the spin wave is excited only by a half wavelength.

Figure 14:
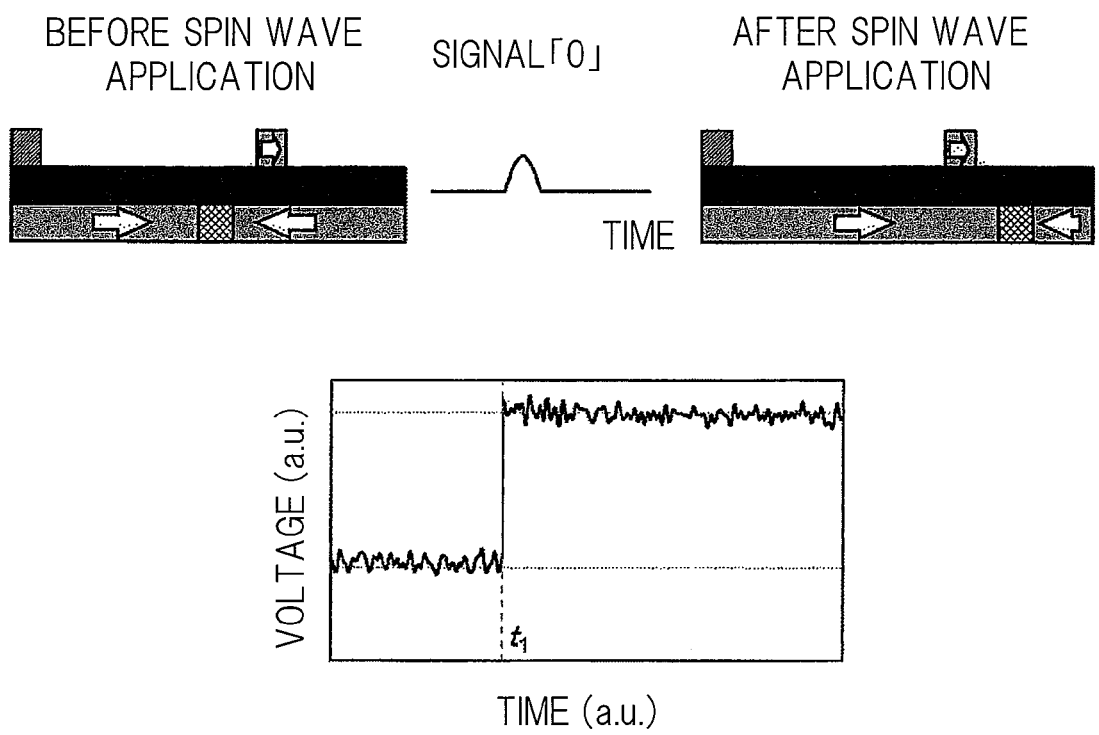
FIG. 14 is a schematic diagram showing movement of a magnetic domain wall 1101 at the time when a spin wave having a signal "0" reaches the magnetic domain wall 1101 in the spin wave device described in the fourth embodiment.

When the spin wave reaches the magnetic domain wall 1101, magnetization inside the magnetic domain wall 1101 and the spin wave interact with each other. As a result, the magnetic domain wall 1101 can be moved. FIG. 14 schematically shows movement of the magnetic domain wall 1101 at the time when the spin wave of the signal "0" reaches the magnetic domain wall 1101. A magnetization direction of the second electrode 104 is parallel to the film surface. In the example shown in FIG. 14, the magnetization direction is the rightward direction. In this example, the magnetic domain wall 1101 before the spin wave reaches is present on the left side of the output portion 106. Therefore, the resistance in the film surface perpendicular direction of the output portion 106 is high resistance because of the magnetoresistance effect. When the spin wave of the signal "0" reaches, the magnetic domain wall 1101 moves to the right side of the output portion 106. The resistance in the film surface perpendicular direction of the output portion 106 changes to low resistance. A temporal change of an output signal obtained by measuring, via a reference resistor, as a voltage, the magnitude of an output current at the time when a micro-voltage is applied to the output portion 106 before and after the spin wave reaches the magnetic domain wall 1101 is also shown in FIG. 14. In the figure, at $t_1$, the output signal increases because the magnetic domain wall 1101 moves and the resistance changes.

Figure 15:
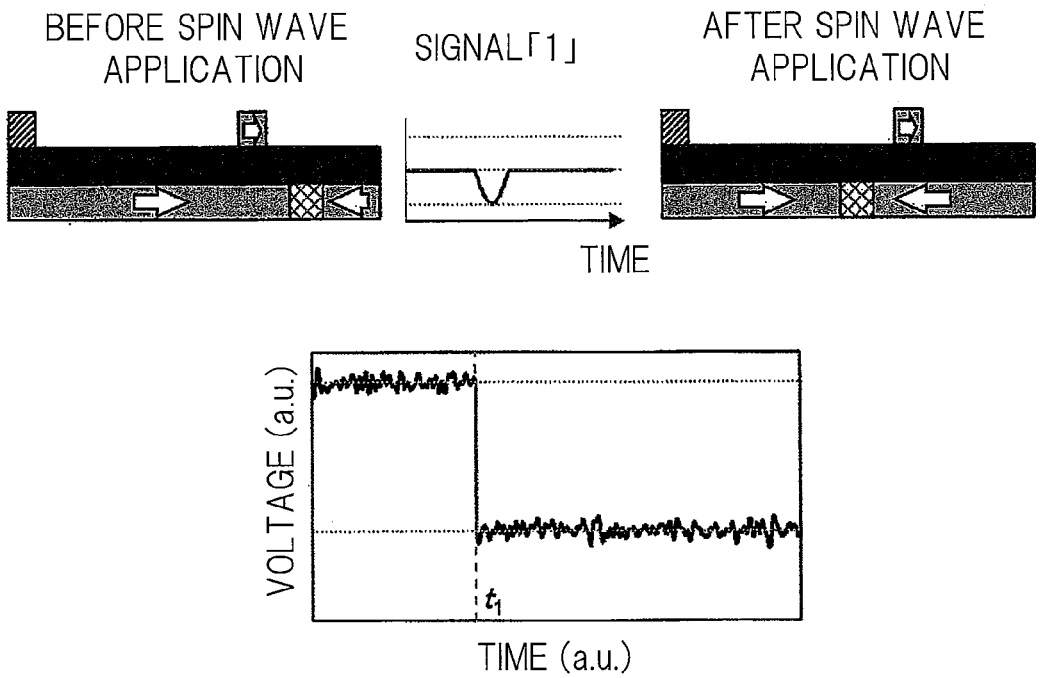
FIG. 15 is a schematic diagram showing movement of the magnetic domain wall 1101 at the time when a spin wave having a signal "1" reaches the magnetic domain wall 1101 in the spin wave device described in the fourth embodiment.

On the other hand, FIG. 15 schematically shows movement of the magnetic domain wall 1101 at the time when the spin wave of the signal "1" reaches the magnetic domain wall 1101. In this example, the magnetic domain wall 1101 before the spin wave reaches is present on the right side of the output portion 106. Therefore, the resistance in the film surface perpendicular direction of the output portion 106 is low resistance because of the magnetoresistance effect. When the spin wave of the signal "1" reaches, the magnetic domain wall 1101 moves to the right side of the output portion 106. The resistance in the film surface perpendicular direction of the output portion 106 changes to high resistance. Therefore, the output signal decreases because the magnetic domain wall 1101 moves and the resistance changes at $t_1$.

As explained above, in the spin wave device 1100 into which the magnetic domain wall 1101 is introduced, as a result of the propagation of the spin wave of "0" or "1", the magnetic domain wall 1101 moves and the resistance of the output portion 106 changes. A characteristic of the spin wave device 1100 is that, even after the spin wave propagates to be attenuated, it is possible to continue to keep (latch) information. By controlling the amplitude of the electric field applied to the second electrode 104, it is possible to locally fix a magnetization direction of a part of the first ferromagnetic layer 101 right under the second electrode 104. This is because magnetic anisotropy changes, with an electric field, only in a part of the first ferromagnetic layer 101 right under the second electrode 104. By making use of this, it is also possible to control the spin wave not to propagate in the first ferromagnetic layer 101 from the first electrode 103 passing over the second electrode 104.

Figure 16:
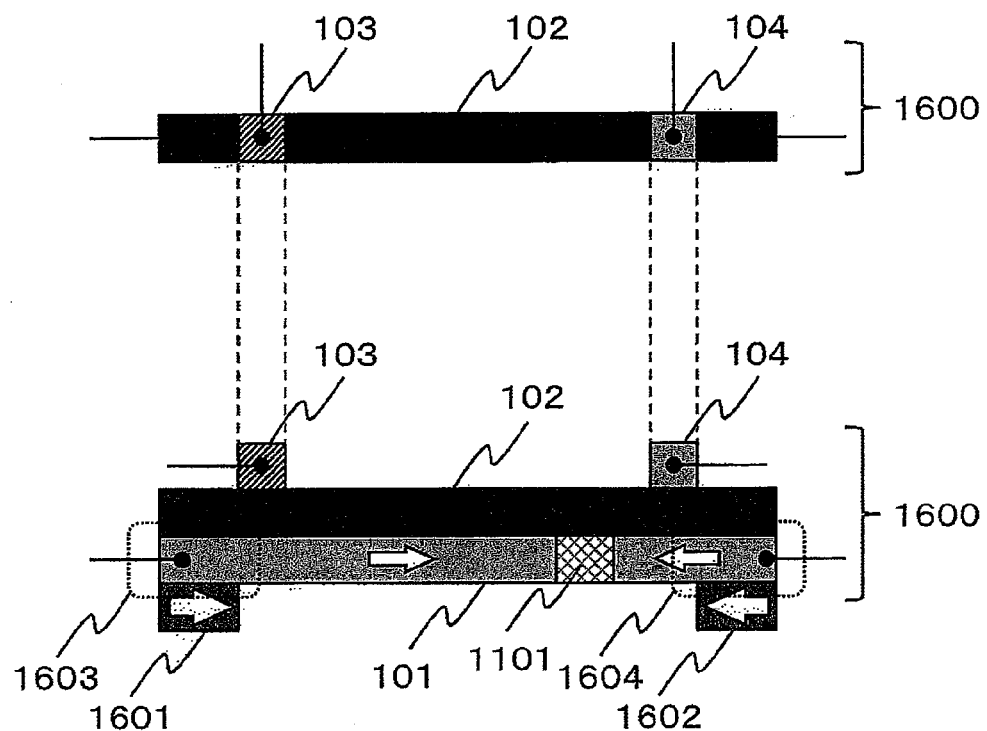
FIG. 16 is a conceptual diagram of a spin wave device into which a magnetic domain wall including magnetization fixed layers 1601 and 1602 is introduced described in a fifth embodiment.

Several methods are conceivable as a method of introducing the magnetic domain wall 1101 into the first ferromagnetic layer 101. For example, a mechanism for strongly fixing magnetization in a part of the first ferromagnetic layer 101 may be provided. In an example shown in FIG. 16, a mechanism for locally applying a magnetic field to the first ferromagnetic layer 101 may be provided. In the example shown in FIG. 16, a spin wave device 1600 including magnetization fixing layers 1601 and 1602 is shown. The magnetization fixing layers 1601 and 1602 are desirably made of a ferromagnetic material having magnetic anisotropy larger than the magnetic anisotropy of the first ferromagnetic layer 101. The magnetization fixing layers 1601 and 1602 are manufactured such that magnetization direction of the magnetization fixing layers 1601 and 1602 are antiparallel to each other. By manufacturing the magnetization fixing layers 1601 and 1602 in this way, magnetizations of parts 1603 and 1604 of the first ferromagnetic layer in contact with the magnetization fixing layers 1601 and 1602 are strongly fixed in antiparallel to each other.

In order to more strongly fix the magnetization, a method of using an antiferromagnetic material as the magnetization fixing layers 1601 and 1602 is also effective. When the antiferromagnetic material is used, a magnetization direction is strongly fixed by exchange coupling of the antiferromagnetic material and the ferromagnetic material. As the antiferromagnetic material, IrMn, PtMn, and the like are representative. However, a material with which the exchange coupling strongly works is desirable. In this case as well, the magnetization fixing layers 1601 and 1602 are manufactured such that the magnetizations of the parts 1603 and 1604 of the first ferromagnetic layer in contact with the magnetization fixing layers 1601 and 1602 are strongly fixed in antiparallel to each other.

The magnetization fixing layers 1601 and 1602 are desirably provided in positions apart from the first electrode 103 and the second electrode 104. A reason for this is that, since the magnetizations of the parts 1603 and 1604 of the first ferromagnetic layer in contact with the magnetization fixing layers 1601 and 1602 are fixed in one direction according to the influence of the magnetization fixing layers 1601 and 1602, it is conceivable that it is difficult to excite the spin wave or the amplitude of the spin wave decreases.

In the spin wave device 1600 manufactured in this way, since the magnetizations of the parts 1603 and 1604 of the first ferromagnetic layer in contact with the magnetization fixing layers 1601 and 1602 are strongly fixed in antiparallel to each other, a boundary in the magnetization direction needs to be always present between the parts 1603 and 1604 of the first ferromagnetic layer. Therefore, at least one magnetic domain wall 1101 is introduced.

As another method of introducing a magnetic domain wall, a mechanism for locally applying a magnetic field to the first ferromagnetic layer 101 may be provided. When this method is applied, it is possible to use a magnetic field generated by feeding an electric current. A wire for feeding an electric current is manufactured on the side of the first ferromagnetic layer 101 to be spaced apart from the first ferromagnetic layer 101. When an electric current is fed to the wire, a magnetic field is generated. The magnetic domain wall is introduced by changing the magnetization direction of the first ferromagnetic layer 101 with the magnetic field.

In the spin wave device manufactured by such a method, it is possible to continue to keep information as explained above. Therefore, the spin wave device can be used as a spin wave device capable of latching information.

Fifth Embodiment

According to still another viewpoint of the invention, it is possible to convert two input signals respectively into spin waves and cause the two spin waves to interfere with each other to thereby cause the spin waves to operate like a logic gate, and output logic. By disposing the logic gate by the spin wave device in multiple stages, it is possible to form a logic circuit. In a fifth embodiment, an operation principle of a spin wave device that operate as an AND gate with respect to two inputs is explained as an example.

Figure 17:
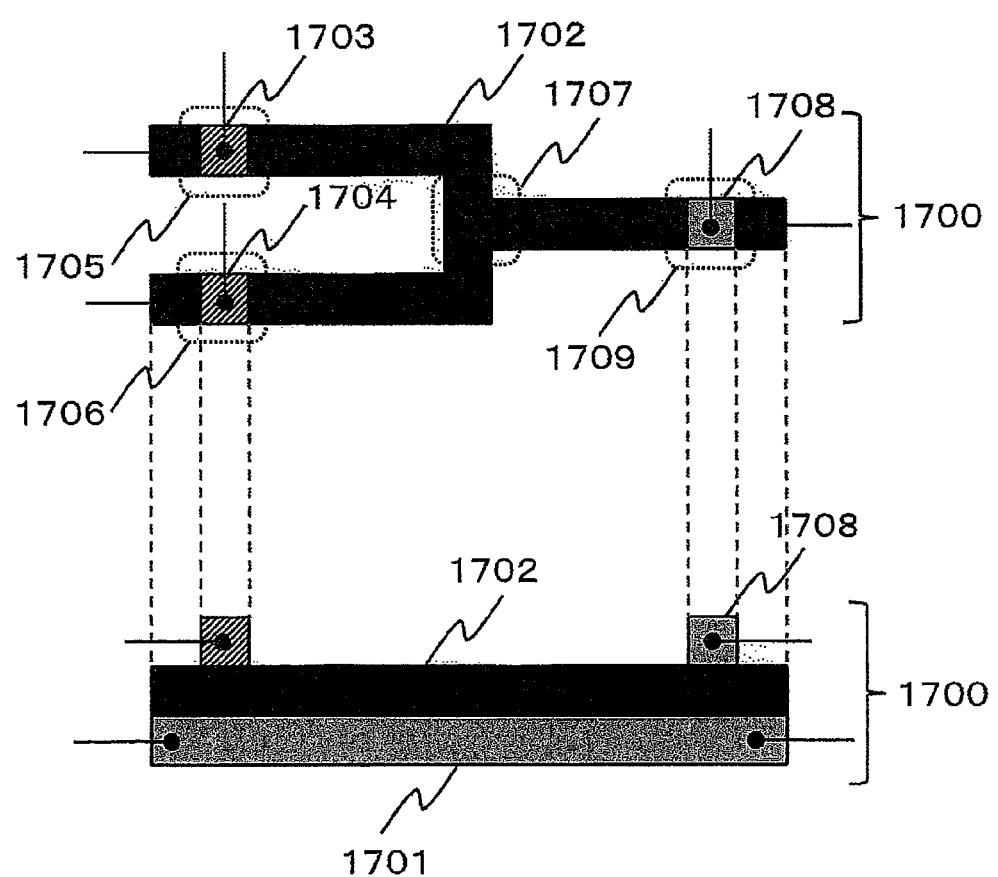
FIG. 17 is a conceptual diagram of a spin wave device operating as an AND gate described in the fifth embodiment.

FIG. 17 schematically shows a spin wave device 1700 that operates as an AND gate. The spin wave device 1700 includes a thin line-shaped stacked body in which a first ferromagnetic layer 1701 and a first nonmagnetic layer 1702 are stacked in this order and includes a first electrode 1703 on the first nonmagnetic layer 1702. Similar another thin line-shaped stacked body is present. The stacked body includes a second electrode 1704 on the first nonmagnetic layer 1702. A part of the first nonmagnetic layer 1702 and the first ferromagnetic layer 1701 present right under the first electrode 1703 configure a first input portion 1705 including the first electrode 1703. A part of the first nonmagnetic layer 1702 and the first ferromagnetic layer 1701 present right under the second electrode 1704 configure a second input portion 1706 including the second electrode 1704. The two thin line-shaped stacked bodies merge in an interference portion 1707 to be one thin-line shape. Merged one thin line-shaped stacked body includes a third electrode 1708 on the first nonmagnetic layer 1702. A part of the first nonmagnetic layer 1702 and the first ferromagnetic layer 1701 present right under the third electrode 1708 configure an output portion 1709 including the third electrode 1708. The third electrode 1708 is made of a ferromagnetic material.

In order to respectively apply electric fields between the first electrode 1703 and the first ferromagnetic layer 1701 and between the second electrode 1704 and the first ferromagnetic layer 1701, an electrode is provided in the first ferromagnetic layer 1701. The spin wave device 1700 includes a mechanism for reading resistance in a film surface perpendicular direction of the output portion 1709 (a mechanism for applying a micro-voltage of a degree not affecting magnetization of the third electrode 1708 and the first ferromagnetic layer 1701 and reading an electric current or a mechanism for applying a micro-current and reading a voltage). The spin wave device 1700 includes, on the outside, a mechanism for generating a clock signal.

Figure 18:
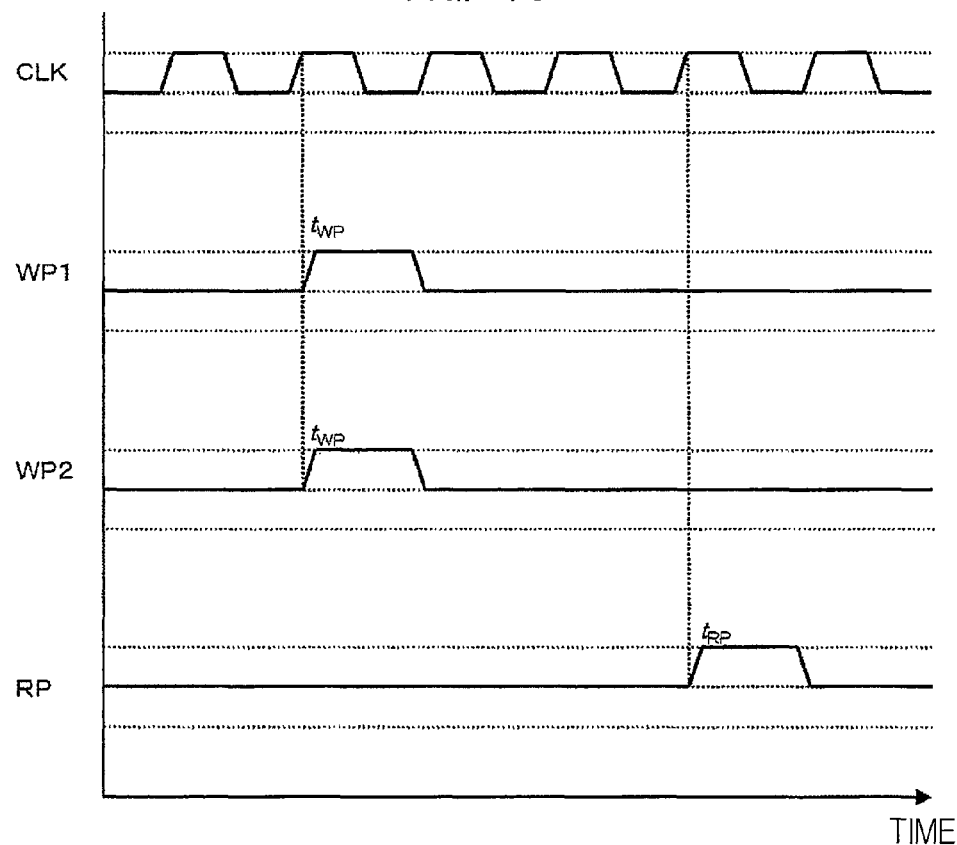
FIG. 18 is a conceptual diagram showing operation timings of a clock signal, a write pulse WP applied from a first electrode 1703 and a second electrode 1704, and a read pulse RP applied from a third electrode 1708 in the spin wave device operating as the AND gate described in the fifth embodiment.

FIG. 18 is a diagram showing, as an example, operation timings of a clock signal, a write pulse 1 (WP1) applied from the first electrode 1703, a write pulse 2 (WP2) applied from the second electrode 1704, and a read pulse (RP) applied from the third electrode 1708 in the spin wave device 1700 described in the fifth embodiment. As it is seen from the figure, in the example of the fifth embodiment, the WP1 and the WP2 are applied at the same timing.

As a generation method for a spin wave in the first input portion 1705 and the second input portion 1706, the method described in any one of the first to third embodiments is applied. In the fifth embodiment, the spin wave generating method described in the third embodiment is applied. That is, the information of "0" or "1" of the spin wave is characterized by the amplitude of the spin wave.

Figure 19:
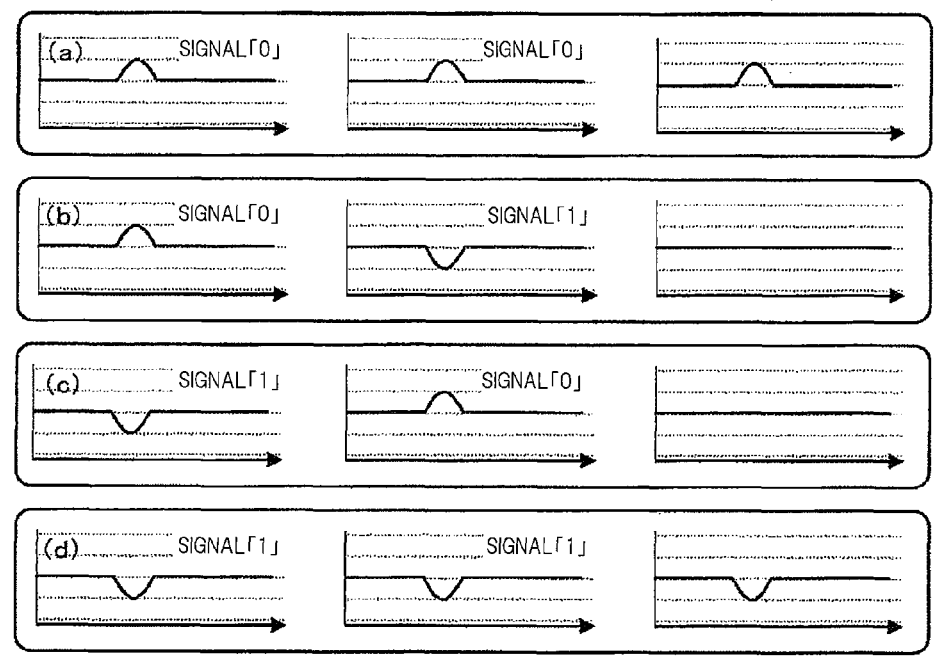
FIG. 19 is a schematic diagram showing a spin wave detected by an output portion 1709 with respect to signals input in a first input portion 1705 and a second input portion 1706 in the spin wave device operating as the AND gate described in the fifth embodiment.

Spin waves simultaneously generated at time $t_{WP}$ synchronizing with the clock signal in the first input portion 1705 and the second input portion 1706 propagate in the first ferromagnetic layer 1701 at the same speed and interfere with each other in the interference portion 1707. As a result, the spin wave propagated to the output portion 1709 is different depending on the spin wave of "0" or "1" respectively input in the first input portion 1705 and the second input portion 1706. FIG. 19 shows a spin wave detected in the output portion 1709 with respect to signals input in the first input portion 1705 and the second input portion 1706.

FIG. 19(a) shows a spin wave at the time when a signal "0" is input in the first input portion 1705 and the second input portion 1706 and a spin wave propagated to the output portion 1709 via the interference portion 1707. The spin wave propagated to the output portion 1709 has plus amplitude. FIG. 19(*b*) shows a spin wave at the time when the signal "0" is input in the first input portion 1705 and the signal "1" is input in the second input portion 1706 and a spin wave propagated to the output portion 1709 via the interference portion 1707. In this case, since the input spin waves cancel each other according to interference, a spin wave is not observed in the output portion 1709. FIG. 19(*c*) shows a spin wave at the time when the signal "1" is input in the first input portion 1705 and the signal "0" is input in the second input portion 1706 and a spin wave propagated to the output portion 1709 via the interference portion 1707. Similarly, a spin wave is not observed in the output portion 1709. FIG. 19(*d*) shows a spin wave at the time when the signal "1" is input in the first input portion 1709 and the second input portion 1706 and a spin wave propagated to the output portion 1709 via the interference portion 1707. The spin wave propagated to the output portion 1709 has minus amplitude.

In the output portion 1709, an RP pulse is applied at time $t_{RP}$ synchronizing with the clock signal. An electric current flowing in the film surface perpendicular direction of the output portion 1709 is read. In magnetization of a part of the first ferromagnetic layer 1701 included in the output portion 1709, a magnetization direction changes with the generated spin wave. Therefore, since the resistance in the film surface perpendicular direction of the output portion 1709 changes with the magnetoresistance effect, it is possible to distinguish the propagated spin wave.

From the result explained above, it is possible to use the spin waves as an OR gate by, for example, determining a threshold to set amplitude as Low when the amplitude is equal to or lower than 0. It is possible to manufacture a logic gate such as AND, NOR, or NAND by changing the threshold or combining the spin waves. It is also possible to configure a logic circuit by disposing, in multiple stages, the logic gate using the spin wave device manufactured in this way.

Figure 20:
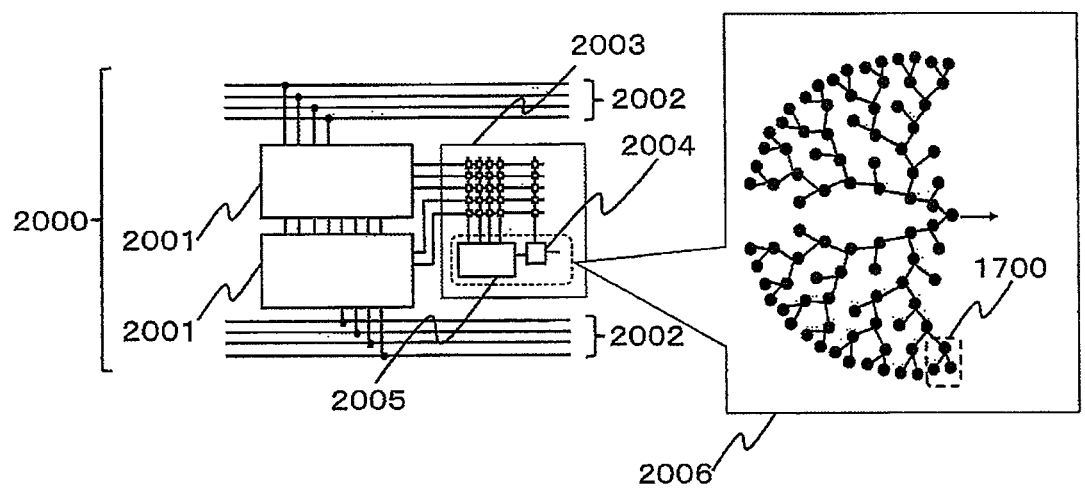
FIG. 20 is a schematic diagram showing an FPGA basic configuration using a spin wave device.

Therefore, by using the spin wave device, it is possible to configure a logic circuit with power consumption reduced more than in the CMOS device currently in use. FIG. 20 shows a schematic diagram of an FPGA configured using a spin wave device. The spin wave device is used in a configurable logic block (CLB) 2003. In FIG. 20, as an example, a lookup table (LUT) 2005 is configured by a spin wave device. As it is seen from an LUT 2006 configured using the spin wave device, a logic circuit is realized by disposing the spin wave device 1700 in multiple stages. It is also possible to configure a switch box 2001, a flip-flop (FF) 2004, and the like with the spin wave device.

REFERENCE SIGNS LIST

100 Spin wave device
101 First ferromagnetic layer
102 First nonmagnetic layer
103 First electrode
104 Second electrode
105 Input portion
106 Output portion
300 Circuit configuration of the spin wave device
301 First selection transistor
302 Second selection transistor
303 First bit line
304 Second bit line
305 Source line
306 First word line
307 Second word line
308 Bit line driver
309 Source line driver
310 Word line driver
311 Clock input line of the bit line driver 308
312 Clock input line of the source line driver 309
313 Clock input line of the word line driver 310
400 Circuit configuration of the spin wave device
1100 Spin wave device into which a magnetic domain wall is introduced
1101 Magnetic domain wall
1600 Spin wave device into which a magnetic domain wall including a magnetization fixing layer is introduced
1601 First magnetization fixing layer
1602 Second magnetization fixing layer
1603 Part of the first ferromagnetic layer in contact with the first magnetization fixing layer 1601
1604 Part of the first ferromagnetic layer in contact with the second magnetization fixing layer 1602
1700 Logic circuit using the spin wave device
1701 First ferromagnetic layer
1702 First nonmagnetic layer
1703 First electrode
1704 Second electrode
1705 First input portion
1706 Second input portion
1707 Interference portion
1708 Third electrode
1709 Output portion
2000 FPGA basic configuration using the spin wave device
2001 Switch box
2002 Global wire
2003 Configurable logic block (CLB)
2004 Flip-flop (FF)
2005 Lookup table (LUT)
2006 LUT configured using the spin wave device

The invention claimed is:

1. A spin wave device comprising:
   a thin line-shaped stacked body including a first ferromagnetic layer and a nonmagnetic layer formed on the first ferromagnetic layer;
   a first electrode of a nonmagnetic material formed in a first region on the first nonmagnetic layer;
   electric-field applying means for applying an electric field to the first electrode to thereby generate a spin wave in the first ferromagnetic layer; and
   a second electrode of a ferromagnetic material for detecting, with a magnetoresistance effect, a phase or amplitude of the spin wave propagated in the first ferromagnetic layer, the second electrode being formed in a second region on the first nonmagnetic layer.

2. The spin wave device according to claim 1, further comprising a circuit that generates a clock signal, wherein
   a frequency of the spin wave synchronizes with a frequency of the clock signal, and
   timing for applying the electric field to the first electrode and timing for performing the detection by the magnetoresistance effect synchronize with the clock signal.

3. The spin wave device according to claim 1, wherein
   the first electrode is electrically connected to a source electrode of a first selection transistor,
   the second electrode is electrically connected to a source electrode of a second selection transistor,
   a drain electrode of the first selection transistor is electrically connected to a first bit line, a gate electrode of the first selection transistor is electrically connected to a first word line,
a drain electrode of the second selection transistor is electrically connected to a second bit line,
a gate electrode of the second selection transistor is electrically connected to a second word line,
both ends of the first ferromagnetic layer are respectively connected to source lines, and
the spin wave device applies a voltage to the first bit line and the first word line, turns on the first selection transistor to excite the spin wave, applies a voltage to the second bit line and the second word line, and turns on the second selection transistor to read resistance in the second region.

4. The spin wave device according to claim 1, wherein
the first electrode is electrically connected to a first bit line,
the second electrode is electrically connected to a second bit line,
the first ferromagnetic layer in the first region is electrically connected to a drain electrode of a first selection transistor,
the first ferromagnetic layer in the second region is electrically connected to a drain electrode of a second selection transistor,
a source electrode of the first selection transistor and a source electrode of the second selection transistor are respectively electrically connected to source lines,
a gate electrode of the first selection transistor is electrically connected to a first word line,
a gate electrode of the second selection transistor is electrically connected to a second word line, and
the spin wave device applies a voltage to the first bit line and the first word line, turns on the first selection transistor to excite the spin wave, applies a voltage to the second bit line and the second word line, and turns on the second selection transistor to read resistance in the second region.

5. The spin wave device according to claim 1, further comprising magnetic-field applying means for controlling a propagation direction of the spin wave.

6. The spin wave device according to claim 1, wherein
the first ferromagnetic layer and the second electrode are made of a ferromagnetic material containing at least one or more kinds of 3d transfer metal, and
the first nonmagnetic layer is made of a material containing oxygen.

7. The spin wave device according to claim wherein
timing of the electric field applied to the first electrode is different such that the phase of the spin wave is different by approximately $\pi/2$ according to an input signal of "0" or "1", and
in the second electrode, the difference in the phase of the spin wave is detected by the magnetoresistance effect.

8. The spin wave device according to claim 1, wherein
timing of the electric field applied to the first electrode is different such that the phase of the spin wave is different by approximately $\pi$ according to an input signal of "0" or "1", and
in the second electrode, the difference in the phase of the spin wave is detected by the magnetoresistance effect.

9. The spin wave device according to claim 1, wherein
a magnetic domain wall is introduced into the first ferromagnetic layer,
the magnetic domain wall moves with the spin wave in a different amplitude direction according to an input signal of "0" or "1", and
in the second electrode, the difference in the amplitude direction of the spin wave is detected by the magnetoresistance effect.

10. The spin wave device according to claim 9, wherein relative positions of the second electrode and the magnetic domain wall can be detected by the magnetoresistance effect even after the spin wave is attenuated.

11. The spin wave device according to claim 9, wherein
the first ferromagnetic layer includes two magnetization fixing layers, and
the two magnetization fixing layers are a ferromagnetic material having magnetic anisotropy larger than the magnetic anisotropy of the first ferromagnetic layer.

12. The spin wave device according to claim 9, wherein
the first ferromagnetic layer includes two magnetization fixing layers, and
the two magnetization fixing layers are an antiferromagnetic material.

13. The spin wave device according to claim 1, wherein
by controlling amplitude of an electric field applied to the second electrode,
a magnetization direction of a part of the first ferromagnetic layer in the second region is locally fixed, and
the spin wave is controlled not to propagate in the first ferromagnetic layer from the first electrode passing over the second electrode.

14. A logic circuit using a spin wave device, comprising:
first and second thin line-shaped stacked bodies including first ferromagnetic layers and nonmagnetic layers formed on the first ferromagnetic layers, the first and second stacked bodies merging in an interference portion;
a first electrode of a nonmagnetic material formed in a first region on the first nonmagnetic layer of the first stacked body;
a second electrode of the nonmagnetic material formed in a second region on the first nonmagnetic layer of the second stacked body;
a third electrode of a ferromagnetic material formed in a third region on the first nonmagnetic layer of the merged stacked body; and
electric-field applying means for applying an electric field to the first and second electrodes to thereby generate different spin waves in the first ferromagnetic layer according to input signals, wherein
when the spin waves interfere in the interference portion, the logic circuit applies an arithmetic operation to the two spin waves induced from the first electrode and the second electrode, and
the logic circuit detects, with a magnetoresistance effect, a phase or amplitude of a propagated spin wave, which is an arithmetic operation result, in the third electrode.

15. The logic circuit using the spin wave device according to claim 14, wherein
the logic circuit is connected in multiple stages, and
the logic circuit applies an arithmetic operation by spin wave interference to a plurality of input signals.

* * * * *